United States Patent
Cok

(10) Patent No.: US 8,193,018 B2
(45) Date of Patent: Jun. 5, 2012

(54) PATTERNING METHOD FOR LIGHT-EMITTING DEVICES

(75) Inventor: Ronald S. Cok, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 784 days.

(21) Appl. No.: 11/971,938

(22) Filed: Jan. 10, 2008

(65) Prior Publication Data

US 2009/0179210 A1    Jul. 16, 2009

(51) Int. Cl.
*H01L 21/00* (2006.01)
(52) U.S. Cl. ............ 438/39; 438/42; 438/531; 438/552; 438/717; 257/98; 257/390; 257/435; 257/E21.023; 257/E21.035; 257/E21.038; 257/E21.159; 257/E33.001
(58) Field of Classification Search .................. None
See application file for complete search history.

(56) References Cited

U.S. PATENT DOCUMENTS

| | | | |
|---|---|---|---|
| 4,476,292 A | 10/1984 | Ham et al. | |
| 4,769,292 A | 9/1988 | Tang et al. | |
| 5,247,190 A | 9/1993 | Friend et al. | |
| 5,522,963 A | 6/1996 | Anders, Jr. et al. | |
| 5,824,374 A * | 10/1998 | Bradley et al. | 427/555 |
| 6,146,715 A * | 11/2000 | Kim et al. | 427/555 |
| 6,392,340 B2 | 5/2002 | Yoneda et al. | |
| 6,703,298 B2 | 3/2004 | Roizin et al. | |
| 2006/0283539 A1 | 12/2006 | Slafer et al. | |

FOREIGN PATENT DOCUMENTS

WO    2006/111766    10/2006

OTHER PUBLICATIONS

"Organic Electroluminescent Diodes", by Tang et al., Applied Physics Letters 51, Sep. 21, 1987, pp. 913-915.
"Electroluminescence of doped organic thin films", by Tang et al., Journal of Applied Physics 65, May 1, 1989, pp. 3610-3616.

* cited by examiner

*Primary Examiner* — Charles Garber
*Assistant Examiner* — Yasser Abdelaziez
(74) *Attorney, Agent, or Firm* — Morgan, Lewis & Bockius LLP

(57) ABSTRACT

A method of patterning a substrate that includes locating a single mask film over the substrate and forming first opening portions in first locations in the mask film. First electrical materials are deposited over the substrate and mask film to form patterned areas in the first locations. Second opening portions are formed in second locations different from the first locations in the mask film. Subsequently, second electrical materials are deposited over the substrate and mask film to form patterned areas in the first and second locations.

13 Claims, 8 Drawing Sheets

PATTERNING METHOD FOR LIGHT-EMITTING DEVICES

FIELD OF THE INVENTION

The present invention relates to light-emitting devices, and more particularly to a method for depositing materials in a pattern over a substrate.

BACKGROUND OF THE INVENTION

Light-emitting diode (LED) devices are a promising technology for flat-panel displays and area illumination lamps. The technology relies upon thin-film layers of organic or inorganic materials coated upon a substrate. Organic LED devices generally can have two formats known as small-molecule devices such as disclosed in U.S. Pat. No. 4,476,292, issued Oct. 9, 1984, by Ham et al., and polymer-OLED devices such as disclosed in U.S. Pat. No. 5,247,190, issued Sep. 21, 1993, by Friend et al. Either type of OLED device may include, in sequence, an anode, an organic electroluminescent (EL) element, and a cathode. The organic EL element disposed between the anode and the cathode commonly includes an organic hole-transporting layer (HTL), an emissive layer (EML) and an organic electron-transporting layer (ETL). Holes and electrons recombine and emit light in the EML layer. Tang et al. (Applied Physics Letter, 51, 913 (1987), Journal of Applied Physics, 65, 3610 (1989), and U.S. Pat. No. 4,769,292, issued Sep. 6, 1988) demonstrated highly efficient OLEDs using such a layer structure. Since then, numerous OLEDs with alternative layer structures, including polymeric materials, have been disclosed and device performance has been improved. The use of inorganic light-emitting materials, for example quantum dot particles formed within a polycrystalline, semiconductor matrix, is also known in the art.

Light is generated in an LED device when electrons and holes that are injected from the cathode and anode, respectively, flow through the electron transport layer (ETL) and the hole transport layer (HTL) and recombine in the emissive layer (EML). Many factors determine the efficiency of this light-generating process. For example, the selection of anode and cathode materials can determine how efficiently the electrons and holes are injected into the device; the selection of ETL and HTL can determine how efficiently the electrons and holes are transported in the device, and the selection of EML can determine how efficiently the electrons and holes are recombined and emit light.

A typical LED device uses a glass substrate, a transparent conducting anode such as indium-tin-oxide (ITO), a stack of organic or inorganic layers, and a reflective cathode layer. Light generated from such a device may be emitted through the glass substrate. This is commonly referred to as a bottom-emitting device. Alternatively, a device can include a substrate, a reflective anode, a stack of organic layers, and a top transparent electrode layer. Light generated from such an alternative device may be emitted through the top transparent electrode. This is commonly referred to as a top-emitting device.

LED devices can employ a variety of light-emitting organic materials patterned over a substrate that emit light of a variety of different frequencies, for example red, green, and blue, to create a full-color display. For small-molecule organic materials, such patterned deposition is done by evaporating materials and is quite difficult, requiring, for example, expensive metal shadow-masks. Each mask is unique to each pattern and device design. These masks are difficult to fabricate and must be cleaned and replaced frequently. Material deposited on the mask in prior manufacturing cycles may flake off and cause particulate contamination. Moreover, aligning shadow-masks with a substrate is problematic and often damages the materials already deposited on the substrate. Further, the masks are subject to thermal expansion during the organic material deposition process, reducing the deposition precision and limiting the resolution and size at which the pattern may be formed. Polymer LED materials may be deposited in liquid form and patterned using expensive photolithographic techniques.

Alternatively, skilled practitioners employ a combination of emitters, or an unpatterned broad-band emitter, to emit white light together with patterned color filters, for example, red, green, and blue, to create a full-color display. The color filters may be located on the substrate, for a bottom-emitter, or on the cover, for a top-emitter. For example, U.S. Pat. No. 6,392,340 entitled "Color Display Apparatus Having Electroluminescence Elements" issued May 21, 2002, by Yoneda et al., illustrates such a device. However, such designs are relatively inefficient since approximately two-thirds of the light emitted may be absorbed by the color filters.

The use of polymer, rather than metal, masks is known in the prior art. For example, WO2006/111766, published Oct. 26, 2006, by Speakman et al., describes a method of manufacturing, comprising applying a mask to a substrate; forming a pattern in the mask; processing the substrate according to the pattern; and mechanically removing the mask from the substrate. A method of manufacturing an integrated circuit is also disclosed. However, this method creates significant particulate contamination that can deleteriously affect subsequent processing steps, for example, the deposition of materials or encapsulation of a device. Moreover, subsequent location of a mask over a previously patterned area may damage materials in the previously patterned area.

Patterning a flexible substrate within a roll-to-roll manufacturing environment is also known and described in US2006/0283539, published Dec. 21, 2006, by Slafer et al. However, such a method is not readily employed with multiple patterned substrates employing evaporated deposition. Disposable masks are also disclosed in U.S. Pat. No. 5,522,963, issued Jun. 4, 1996, by Anders, Jr. et al., and a process of laminating a mask to a ceramic substrate is also described. However, a teaching of registering a mask to the substrate is limited in registration and size. A self-aligned process is described in U.S. Pat. No. 6,703,298, issued Mar. 9, 2004, by Roizin et al., for making memory cells. A sputtered disposable mask is patterned and removed by etching. However, as with the prior-art disclosures cited above, the formation of the patterned mask by employing multiple masking, deposition, and processing steps, are not compatible with delicate, especially organic, materials such as are found in OLED displays.

There is a need, therefore, for an improved method for patterning materials over a substrate that improves resolution and efficiency, reduces damage to underlying layers, reduces particulate contamination, scales to large-size substrates, and reduces manufacturing costs.

SUMMARY OF THE INVENTION

The aforementioned need is met in accordance with at least one exemplary embodiment of the present invention that provides a method of patterning a substrate. The method of patterning a substrate includes locating a single mask film over the substrate and forming first opening portions in first locations in the mask film. First electrical materials are deposited over the substrate and mask film to form patterned areas in the first locations. Second opening portions are formed in second locations different from the first locations in the mask film. Subsequently, second electrical materials are deposited over the substrate and mask film to form patterned areas in the first and second locations.

ADVANTAGES

The method of the present invention has the advantage that it improves resolution and efficiency, reduces damage to underlying layers, reduces particulate contamination, scales to large-size substrates, and reduces manufacturing costs for a patterned device formed on a substrate.

It will be understood that the figures are not to scale since the individual components have too great a range of sizes and thicknesses to permit depiction to scale.

DETAILED DESCRIPTION OF THE INVENTION

Figure 3:
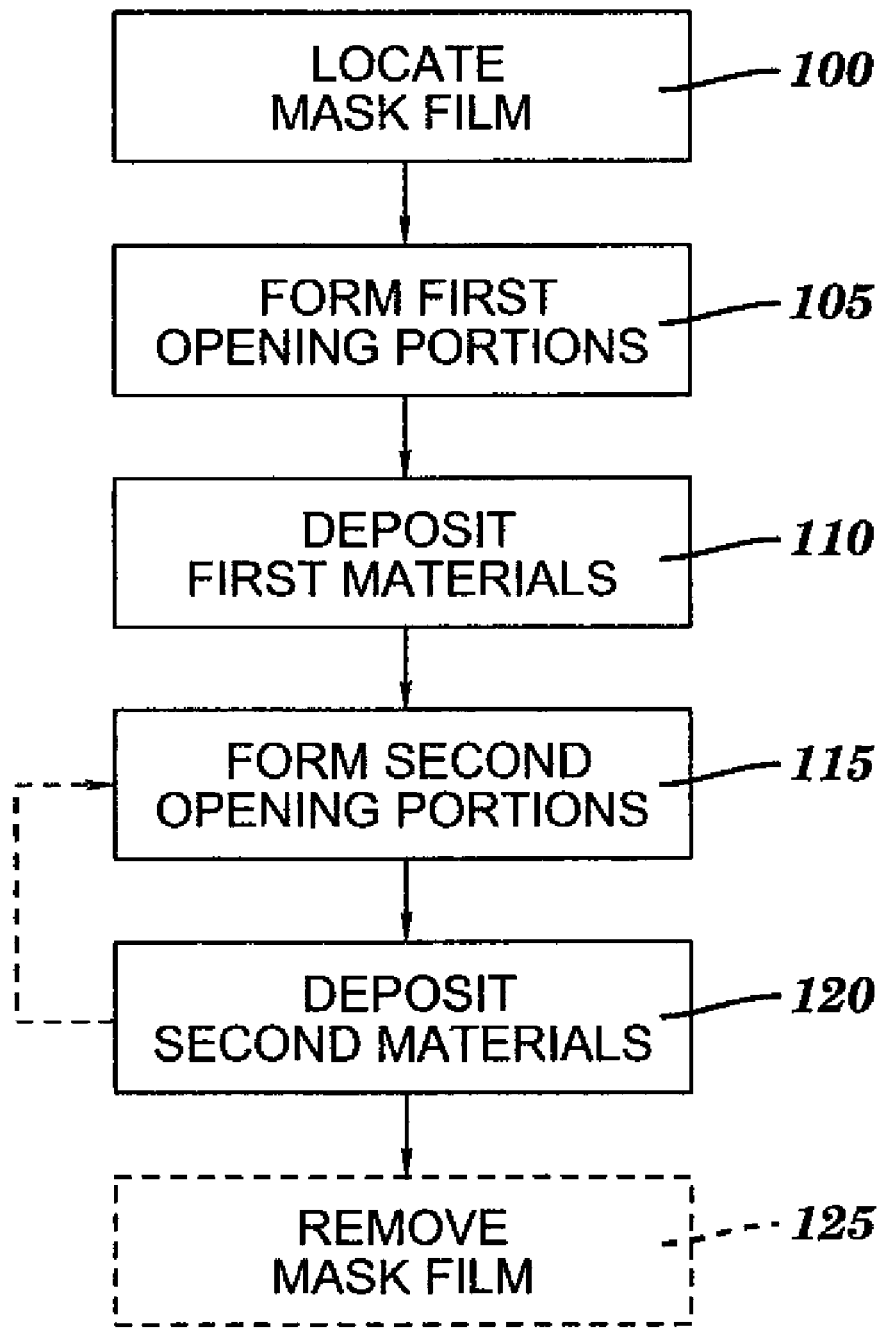
FIG. 3. is a flow chart depicting a method of one exemplary embodiment of the present invention.

Referring to FIG. 3, in accordance with one embodiment of the present invention, a method of patterning a substrate comprises the steps of locating 100 a single mask film over a substrate, forming 105 first opening portions in first locations in the single mask film, depositing 110 first materials over the substrate and single mask film to form patterned areas in the first locations, forming 110 second opening portions in second locations different from the first locations in the single mask film, and depositing 120 second materials over the substrate and single mask film to form patterned areas in the first and second locations. In a further, optional step, the masking film is mechanically removed 125 after the second materials are deposited. According to the present invention and in contrast to the prior art, only a single mask film is employed, while multiple deposition steps are employed to deposit different electrical materials in different locations over the substrate. Moreover, the single mask film can in some embodiments remain in an LED device made according to the method of the present invention.

In a further exemplary embodiment, third opening portions are formed in locations different from the first and second locations in the mask film (repeating step 115 with third opening portions in third locations) and depositing third materials over the substrate and mask film to form patterned areas in the first, second, and third locations (repeating step 120 with third opening portions in third locations). Steps 115 and 120 may be repeated with different locations and materials as many times as desired, as indicated by the dotted, arrowed line. After all of the locations have been opened and materials deposited therein, the mask film may, but does not have to be, removed. Hence, according to the present invention, the second electrical materials in the second opening portions are deposited in a different step from the first electrical materials in the first opening portions, but the first and second electrical materials can serve the same function in the first and second opening portions.

In one exemplary embodiment of the present invention, the mask film can comprise a polymer film. The film can be located over the substrate in a variety of ways. For example, a liquid can be deposited over the substrate and cured to form a film. Since a substrate with thin-film devices and planarization and insulating materials are typically inorganic, and mechanically and environmentally robust, such deposition can be performed without harming the substrate and materials thereon. Alternatively, a pre-made film can be mechanically located over the substrate, for example from a roll of material. Such films can be, for example, between 1 and 100 microns thick.

The electrical materials can affect the flow of electricity or convert electrical energy to light. For example, the materials can be one or more of the following: light-emitting materials, conductive materials, transparent conductive materials, charge-control materials, and semi-conductive materials. The electrical materials can be doped to alter their electrical or light-emissive characteristics. For example, the electrical materials include one or more of the following: organic, metal oxide, silicon, doped silicon, zinc oxide, doped zinc oxide, quantum dots, metal, or metal alloys. The electrical materials can be transparent. The electrical materials can be deposited by evaporation, sputtering, spray, curtain, or inkjet deposition, or other means known in the art. For example, organic materials can be deposited with a linear source, such as the commercially available Kodak Vapor Injection System™. In one embodiment of the present invention, the electrical materials comprise distinct layers. Each layer can comprise different electrical materials and have a different, electrically active function. For example, a first layer can comprise a transparent electrode (e.g. a transparent anode comprising a metal oxide such as indium tin oxide or aluminum zinc oxide), a second layer can comprise a hole-injection layer, a third layer can comprise a hole-transport layer, a fourth layer can comprise a light-emitting layer, a fifth layer can comprise an electron-transporting layer, a sixth layer can comprise an electron-injection layer, and a seventh layer can comprise a second electrode (e.g. a reflective aluminum or silver layer). Thus, the layers can form a bottom-emitting light-emitting diode emitting light through the transparent substrate, as is known in the art.

Figure 1A:
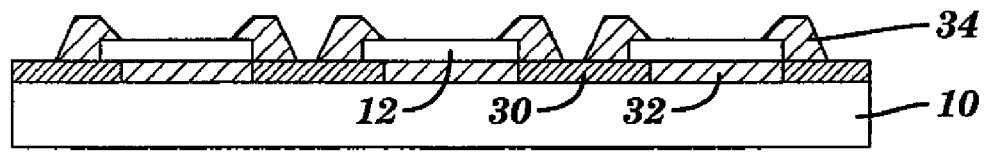
FIGS. 1A-1J are cross sections of an LED device in sequential stages of construction according to a method of an exemplary embodiment of the present invention.
Figure 1B:
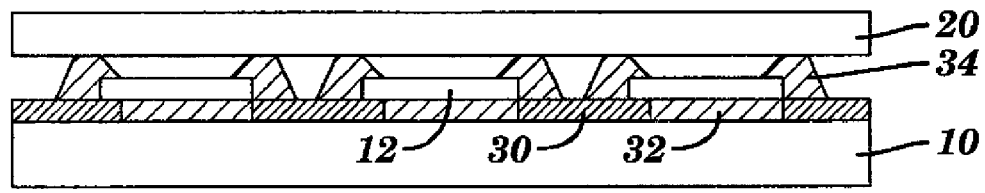
Figure 1C:
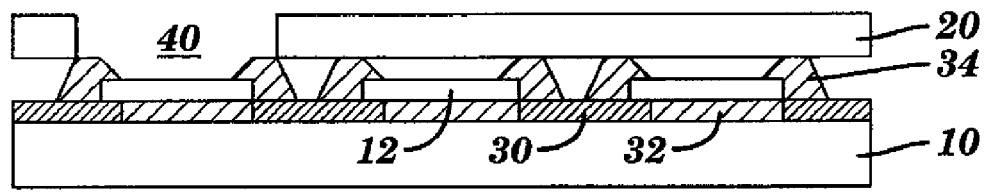
Figure 1D:
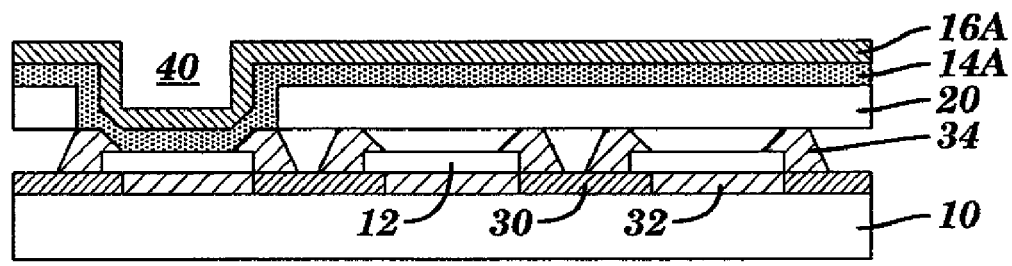
Figure 1E:
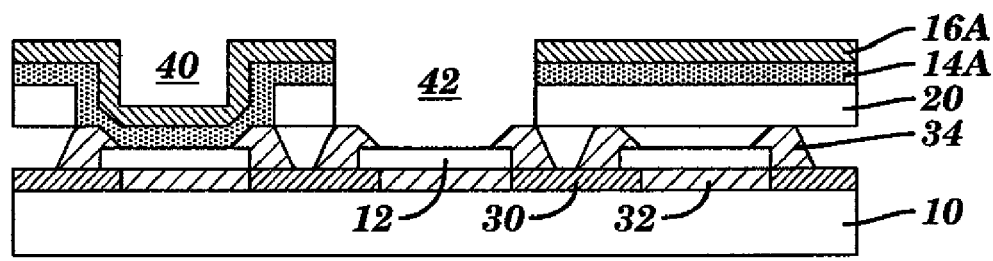
Figure 1F:
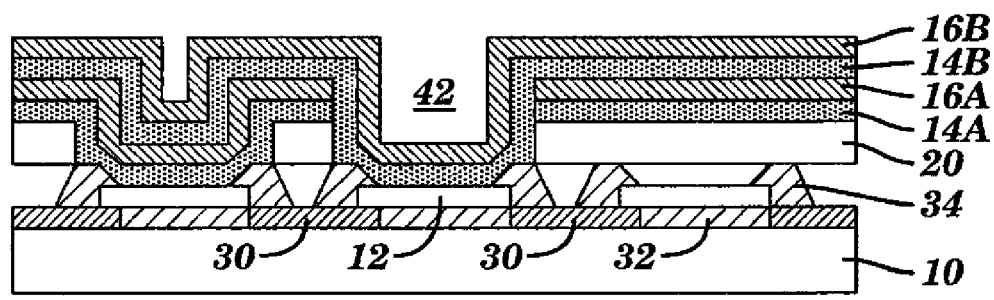
Figure 1G:
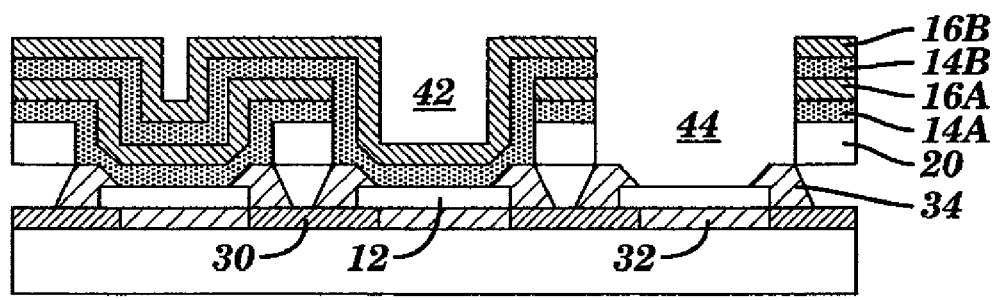
Figure 1H:
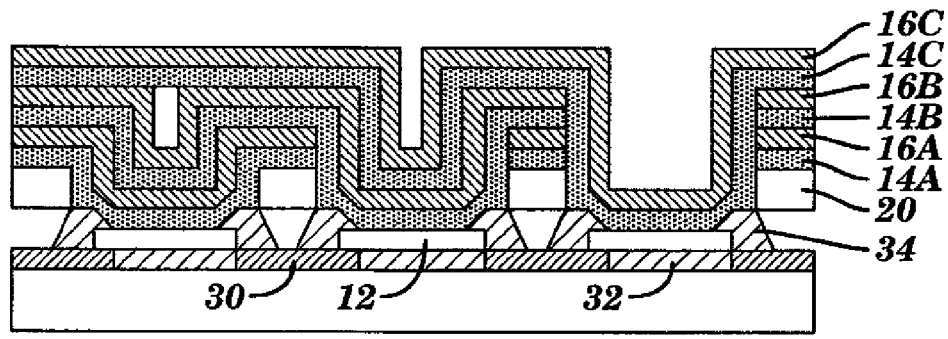
Figure 1I:
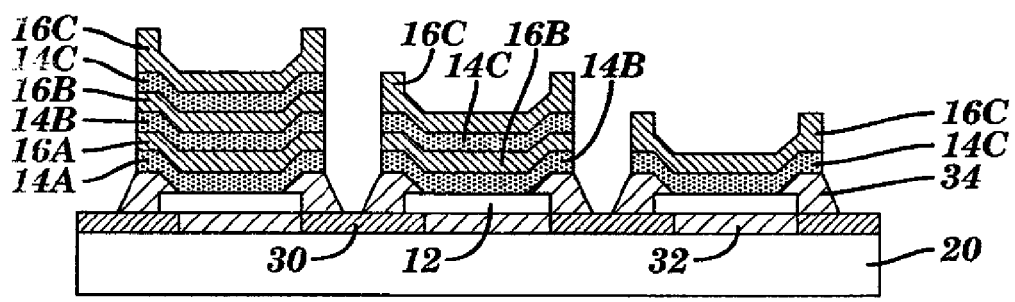
Figure 1J:
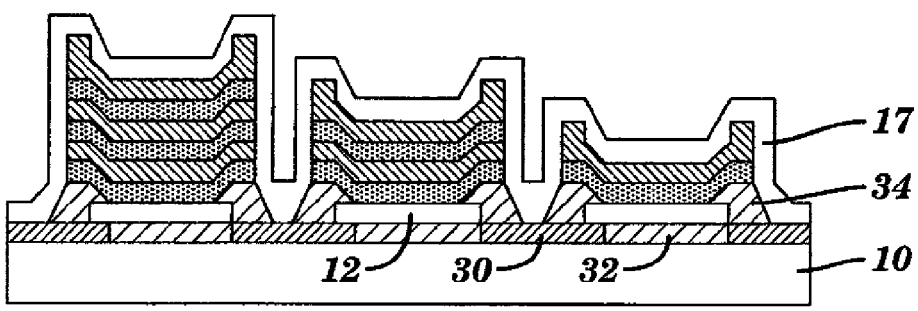

Referring to FIGS. 1A-1J, an exemplary LED device at various, sequential stage of construction is illustrated in cross section. While the method of the present invention can be employed to form both active-matrix and passive-matrix LED devices, only an active-matrix device is illustrated. Referring to FIG. 1A, a transparent substrate 10 has electrical devices 30 (e.g. thin-film transistors, capacitors, conductors) formed thereon, together with a planarization and insulating layer 32. An additional planarization and insulating layer (not shown) can also be formed over the active-matrix electrical devices 30. A patterned, transparent, first electrode 12 is formed over the substrate 10 and planarization and insulating layer 32 and is electrically connected to an electrical device 30. An insulating element 34 is employed at the edges of the transparent, first electrode 12 to prevent electrical shorts between the patterned, transparent first electrodes 12, and also between layers deposited over the patterned, transparent first electrodes 12. Referring to FIG. 1B, a mask film 20 is located over the substrate. In FIG. 1C, a first opening portion 40 is formed in first locations in the mask film 20 (e.g. by laser ablation or equivalently by segmenting the mask film 20 material in the perimeter of the first opening portion 40 and removing the segmented portion of the mask film 20). Herein, "segmenting" of the mask film is defined as detaching or separating one piece of mask film from another, so that one piece of mask film can be removed, while leaving another piece of mask film in place. Referring to FIG. 1D, additional layers include first electrical materials (e.g. light-emitting and charge-control layers 14A and reflective, second electrode 16A). Referring to FIG. 1E, a second opening portion 42 is formed in second locations in the mask film 20. Referring to FIG. 1F, layers of second electrical materials (e.g. light-emitting and charge-control layers 14B and reflective, second electrode 16B). Referring to FIG. 1G, a third opening portion 44 is formed in third locations in the mask film 20. Referring to FIG. 1H, layers of third electrical materials are included (e.g. light-emitting and charge-control layers 14C and reflective, second electrode 16C). The first, second, and third electrical materials and layers can be identical. Referring to FIG. 1I, the remaining mask film 20 can be removed to form a patterned, light-emitting diode device. If desired, an additional protective or conductive layer 17 can be deposited over all of the opening portions 40, 42, 44. In some embodiments of the present invention (e.g. active-matrix devices), the second electrodes 16A, 16B, 16C can be electrically common and a conductive layer 17 will electrically connect the second electrodes 16A, 16B, and 16C. Since the second electrodes 16A, 16B, 16C can be thick and reflective, the presence of the layers 14B, 16B, 14C, and 16C over the second electrode 16A in the first opening portions 40 may not affect the emission of light from the light emitting layer 14A in the first opening portions 40. Likewise, since the second electrode 16B can be thick and reflective, the presence of the layers 14C, and 16C over the second electrode 16B in the second opening portions 42 do not affect the emission of light from the light emitting layer 14B in the second opening portions 42.

According to the present invention, materials are deposited through a mask film to form patterned areas over the substrate. However, additional materials can be deposited without patterning or by employing alternative patterning technology, such as photolithography or conventional, prior-art patterning technology. For example, the first layer noted above can comprise a transparent electrode, patterned using conventional technology; the hole-injection and hole-transport layers may be unpatterned, while the light-emitting layer, electron-transport, electron-injection, and the second electrode may be patterned by deposition through a mask film according to the method of the present invention. Moreover, additional layers, patterned or unpatterned, can be deposited above the patterned layers formed in accordance with the present invention. The patterned layers can define light-emitting areas, for example by patterning one of the electrodes, to form individual sub-pixels in a display device.

In one embodiment of the present invention, the last layer deposited in at least one of the patterned areas before the second or third opening portions are formed is a metal layer, metal alloy layer, or metal oxide layer. This layer is protective and mechanically robust, thereby protecting underlying layers (e.g. environmentally sensitive organic layers) from damage due to the steps of forming second or third openings or deposit second or third materials.

As contemplated by the method of the present invention, the first opening portions will have both first and second materials deposited therein, while the second opening portions will only have second materials deposited therein. The first materials can be deposited in the first opening portions in layers forming a transparent, first electrode, charge-control layers, and a light-emitting layer to form a complete light-emitting diode and the last layer of the diode can be a protective, second electrode (e.g. a thick layer of silver or aluminum or metal alloy). (Alternatively, the transparent, first electrode may be formed separately.) The protective, second electrode protects the light-emitting diode from the process of forming the second opening portions and from the deposition of the second materials. As contemplated by the invention, the second materials will be deposited over both the first and the second (and third, if employed) opening portions. However, the protective, second electrode protects the underlying light-emitting diode in the first opening locations. Light-emitted by the light-emitting diode in the patterned areas corresponding to the first opening portions can be emitted through the transparent, or semi-transparent, first electrode and the transparent substrate. Light emitted toward the reflective, protective, second electrode is reflected toward the transparent substrate. Hence, the presence of the second materials over the second electrode does not affect the generation or emission of light in the first opening portion.

Figure 2A:
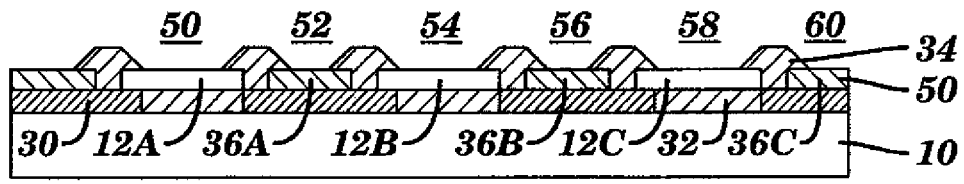
FIGS. 2A-2N are cross sections of an LED device in sequential stages of construction according to an alternative method of an embodiment of the present invention.
Figure 2B:
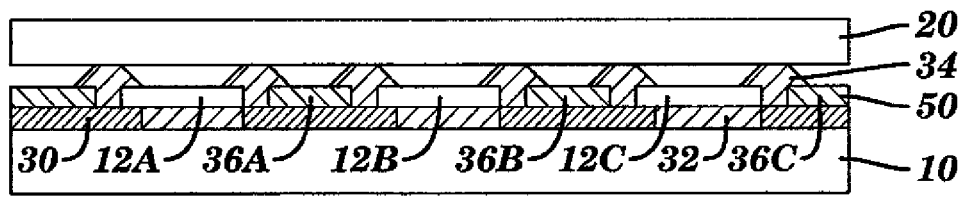
Figure 2C:
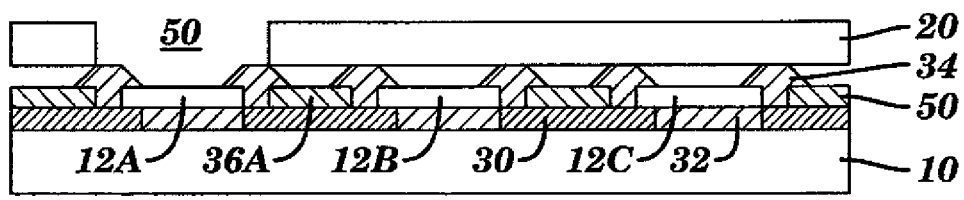
Figure 2D:
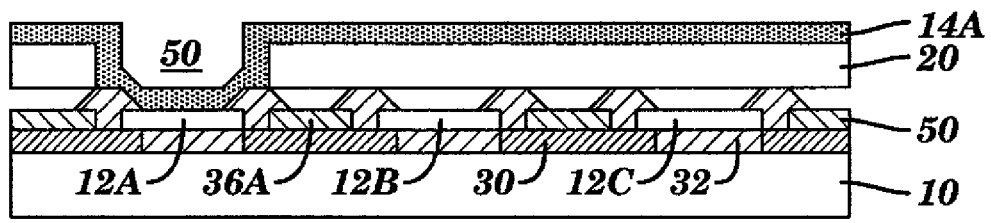
Figure 2E:
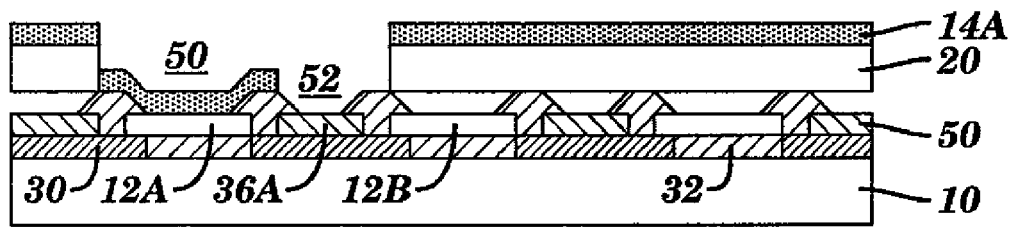
Figure 2F:
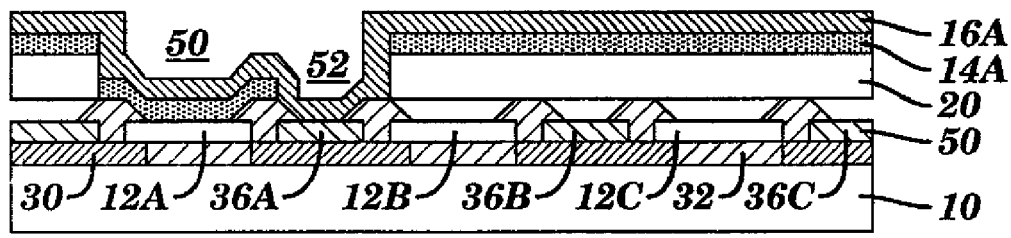
Figure 2G:
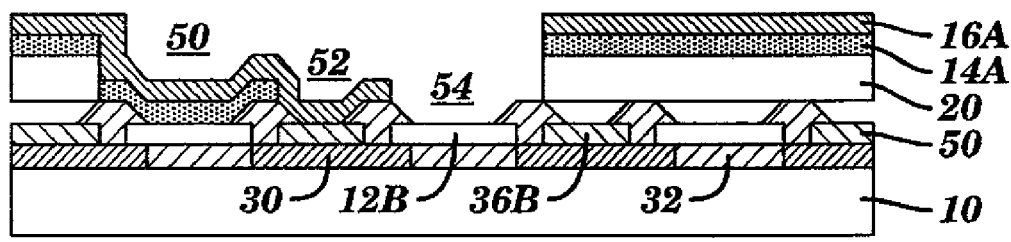
Figure 2H:
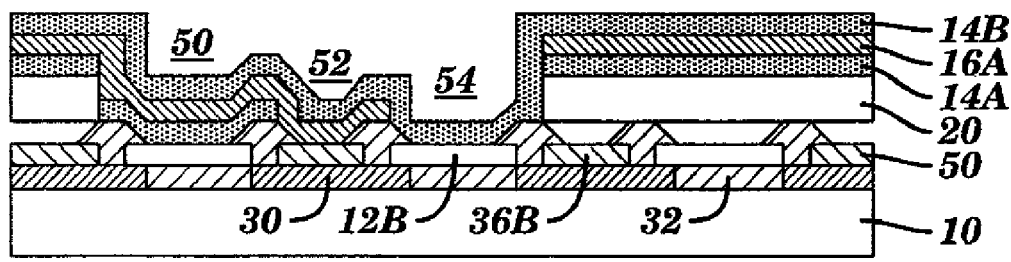
Figure 2I:
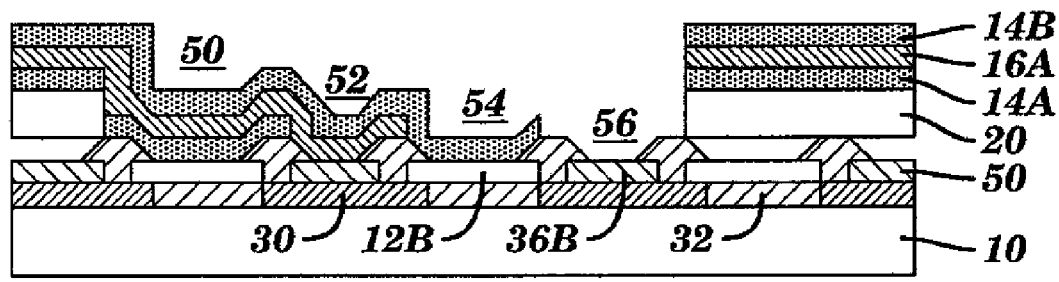
Figure 2J:
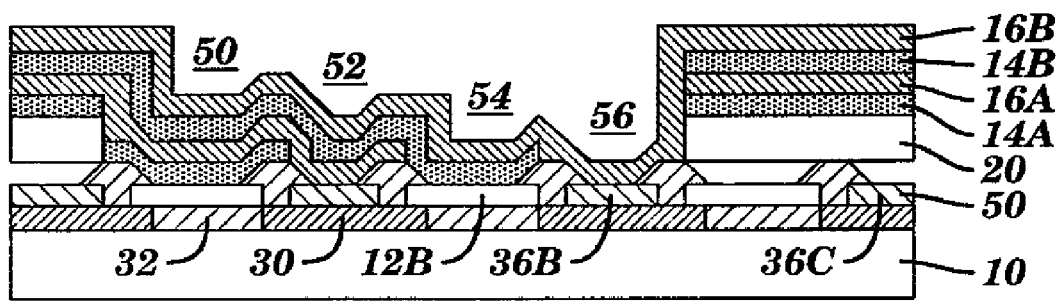
Figure 2K:
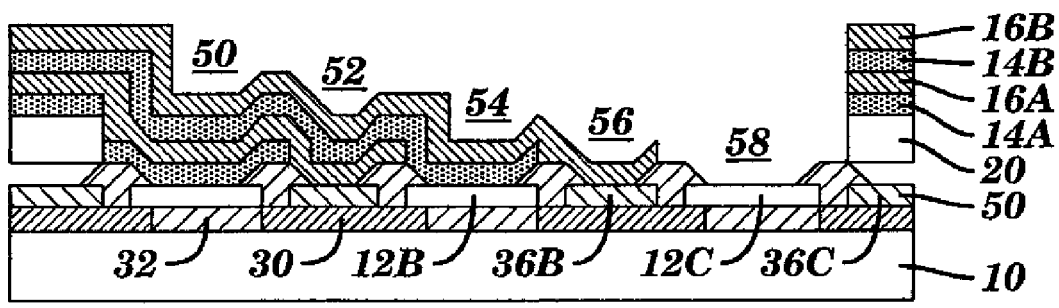
Figure 2L:
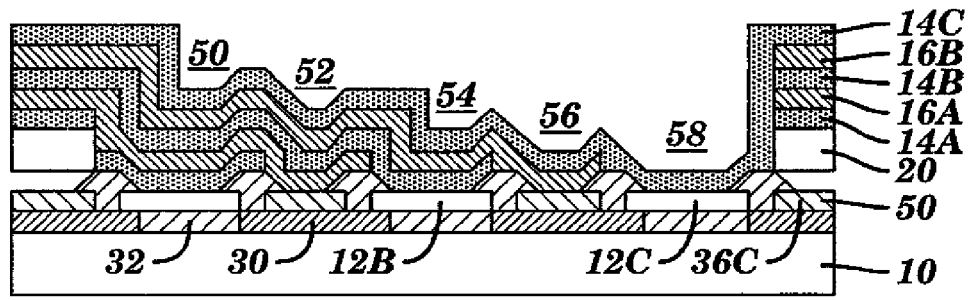
Figure 2M:
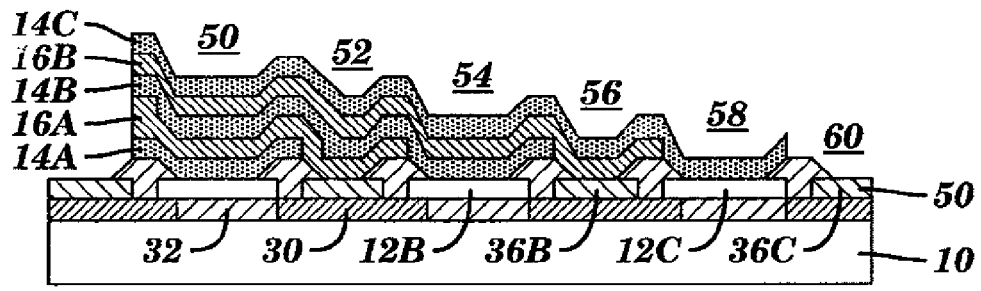
Figure 2N:
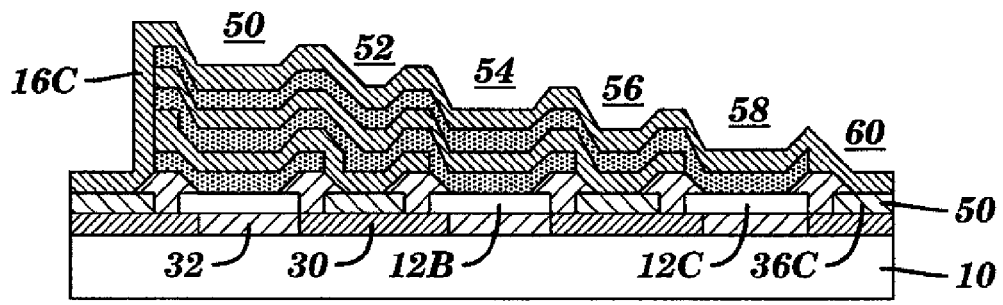

Referring to FIGS. 2A-2N, in a further embodiment of the present invention, patterned conductive bus areas corresponding to second opening locations can be formed over the transparent substrate to improve power distribution to the second electrodes. Referring to FIG. 2A, a transparent substrate 10 has electrical devices 30 (e.g. thin-film transistors, capacitors, conductors) formed thereon, together with a planarization and insulating layer 32. A planarization and insulating layer can also be formed over the active-matrix devices 30 (not shown). Patterned, transparent, first electrodes 12A, 12B, 12C are formed over the substrate 10 and planarization and insulating layer 32 and electrically connected to electrical devices 30. Insulating elements 34 are employed at the edges of the transparent, first electrodes 12A, 12B, 12C to prevent electrical shorts between the patterned first electrodes 12A, 12B, 12C and between layers deposited over the patterned first electrodes 12A, 12B, 12C. Conductive bus areas 36A, 36B, 36C are formed between the first electrodes 12A, 12B, 12C.

Referring to FIG. 2B, a mask film 20 is mechanically located over the substrate 10 and (FIG. 2C) a first opening portion 50 formed over an electrode 12A. Referring to FIG. 2D, a first electrical materials layer 14A is deposited over the mask film and first opening portion 50. In this embodiment, the first electrical materials 14A can (but may not) include an electrode layer. As shown in FIG. 2E, a second opening portion 52 is formed over a conductive bus area 36A and (FIG. 2F, second electrical material 16A deposited. In this case, the second electrical materials 16A form a reflective, electrically conductive electrode which electrically connects the bus area 52 to the first electrical materials 14A and, for example, forms a light-emitting diode with the first electrode 12A with improved power distribution provided by the conductive bus area 52. Referring to FIG. 2G, FIG. 2H, FIG. 2I, and FIG. 2J, the process is repeated with electrical materials 14B deposited in opening portion 54, and electrically connected to bus area 36B through electrical materials 16B in opening portion 56. Referring to FIG. 2K, FIG. 2L, FIG. 2M, and FIG. 2N, the process is repeated yet again with electrical materials 14C deposited in opening portion 58, and electrically connected to bus area 36C through electrical materials 16C in opening portion 60. Hence, the process described in FIGS. 2A-2N forms three, independently controlled light-emitting diodes in three different areas (opening portions 50, 54, 58) over a substrate and with an electrical connection for each LED to a bus area (bus areas 52, 56, 60) for improved power distribution and electrical connection. Since different electrical materials (14A, 14B, 14C) may be employed in each of the three different opening portions 50, 54, 58 to emit different colors of light and form a multi-color pixel in response to a current, a three-color display device may be manufactured. By repeating the process a fourth time, a four-sub-pixel device may be formed. By repeating the process even more times, a device having an arbitrary number of different light-emitting elements can be formed. Further insulating or protective layers may be formed over the last layer of electrical materials (not shown), if desired.

The first electrical materials can be deposited over the light-emitting areas corresponding to the first locations but do not necessarily include materials comprising the second electrode. In this embodiment, materials comprising the reflective second electrode are the second materials and are deposited over both the conductive bus areas and the light-emitting areas (corresponding to the first and second openings) to provide power from the conductive bus area to the light-emitting layers comprising the first materials in the first locations. Hence, the electrical materials deposited in the second opening portion can be a subset of the electrical materials deposited in the first opening portion.

The opening portions may be formed by ablating mask film material in the locations of the opening portions, for example by using laser ablation. Alternatively, the opening portions can be formed by ablating the mask film around the periphery of the first locations and mechanically removing the mask film within the periphery. In a further embodiment of the present invention, at least some of the opening portions may be contiguous, thereby improving the process of mechanically removing the mask film material in the contiguous opening portions. Moreover, in an exemplary embodiment of the present invention, all of the opening portions in the mask film may be segmented, for example by ablating the mask film around the periphery of the locations, before any materials are deposited over the substrate so that there are no deposited materials present to complicate the segmentation process.

In a further embodiment of the present invention, cleaning steps compatible with the mask film or already-deposited electrical materials may be employed after opening portions are formed and before some environmentally sensitive electrical materials are deposited. If such cleaning steps are undertaken for second or third opening portions, it is helpful to have already deposited a thick metal second electrode over the first opening portions to protect the underlying layers from the cleaning process.

The method of the present invention may be employed for an LED device on a substrate, the LED device comprising a transparent substrate, a transparent or semi-transparent, patterned first electrode formed over the transparent substrate defining a plurality of light-emitting areas, one or more first light-emitting layers formed over the first electrode, a reflective, conductive second electrode formed over the one or more light-emitting layers, one or more second light-emitting layers and a conductive layer formed over the second electrode layer in some of the plurality of light-emitting areas.

In a further embodiment of the present invention, the LED device can further comprise one or more patterned, conductive bus areas, the second electrode in electrical contact with at least one patterned, conductive bus area.

In some embodiments of the present invention, a mask film can be located between the second electrode and the one or more second light-emitting layers in some patterned areas. This structure is formed when the mask film is not removed after the deposition of the electrical materials in the opening portions.

The present invention may be employed to pattern a substrate and form distinct operable areas, for example, light-emitting pixels in a display. The materials may be light-emitting materials. For example, organic materials such as small molecule or polymer materials, or inorganic materials such as phosphorescent materials or quantum dots may be used as light-emitting materials. According to the present invention, a contiguous opening portion of a mask film is a single opening or hole in the mask film over two or more different, non-contiguous operable areas. For example, such operable areas are operable to emit light and are separated by inoperable areas that do not emit light.

The electrical materials employed in multiple different deposition steps may be identical. However, in most embodiments of the present invention, the contiguous opening portions in the mask film may be formed in different locations so that different materials and elements may be deposited in different locations over the substrate 10. Moreover, more than one material may be deposited through the contiguous opening portions, as may other materials deposited in layers over the same location on the substrate 10. For example, the materials may comprise a plurality of light-emitting materials in light-emitting layers. The light-emitting materials may be organic materials comprising a small-molecule or polymer molecule light-emitting diodes. Alternatively, the light-emitting materials may be inorganic and comprise, for example, quantum dots. Other layers may comprise charge-control layers such as, for example, hole-injection, hole-transport, hole-blocking, electron-injection, electron-blocking, and electron-transport layers, as well as buffer layers, thin, resistive layers, or conductive, transparent, or semi-transparent layers. Optically active materials, for example light-scattering materials may be deposited. Such materials, layers, and deposition methods (e.g. sputtering or evaporation) are known in the LED art.

According to various embodiments of the present invention, the opening portions of the mask film allow the deposition of materials into the exposed locations. At the same time, the masking portions of the mask film protect the remainder of the area over the substrate from undesirable deposition and particulate contamination caused by the segmenting of the masking film and the deposition of electrical materials. Deposition of material into the exposed locations includes evaporating, sputtering, spray coating, slide coating, hopper coating, or curtain coating materials over the substrate in the exposed locations.

In one exemplary embodiment, opening portions comprise stripes into each of which are deposited light-emitting materials emitting light of a common color. Each stripe is mechanically removed in turn and the electrical materials appropriate for that stripe deposited.

As taught in the prior art, for example, in manufacturing light-emitting devices, deposition masks may be made of metal and are reused multiple times for depositing evaporated organic materials. The masks may be cleaned but are, in any event, expensive, subject to thermal expansion, difficult to align, and problematic to clean. Moreover, the masks eventually wear out.

The present invention does not necessarily employ photolithographic methods of liquid coating, drying, patterned exposure forming cured and uncured areas, followed by a liquid chemical removal of the cured or uncured areas to form a pattern. In contrast, the present invention provides a very low-cost, single-use mask film that is patterned while in place over the substrate, thereby overcoming the limitations of the prior art. The mask film may be formed of flexible thin films of, for example, polymers, either transparent or non-transparent and may be patterned in a completely dry environment, that is, no liquid chemicals must be employed. In embodiments in which the opening portions in the mask film are segmented prior to any electrical material deposition, photolithographic means may be employed. Alternatively, laser ablation of material or segmentation followed by mechanical removal can be employed.

While the mask film 20 need not itself be registered with the patterned areas on the substrate 10, the opening portions correspond with the light desirably-patterned areas and are registered with them. Such registration may be aided by providing, for example, fiducial marks on the substrate. Such marks and the mechanisms for scanning lasers and ablating material to a necessary tolerance are known in the art, as are devices for collecting ablated material. Typical light-emitting areas may be, for example, 40 microns by 100 microns in size. Alternatively, if conventional masks, light exposure, and etching are employed to segment the opening portions of the mask film, the exposure masks must be aligned to the patterned areas on the substrate.

In further embodiments of the present invention, the mask film 20 may be coated with a weak adhesive on one or both sides of the mask film 20 to assist in locating and maintaining the masking film 20 in registration with the substrate 10 and patterned areas. The adhesive may be located on the side of the mask film 20 that it is in contact with, and adjacent to, the substrate 10. The adhesive may prevent, for example, the masking film 20 from moving with respect to the substrate 10 and may also serve to prevent detached masking film material from moving or falling into the patterned areas, or aid in mechanical removal, thus improving the mask film removal process, or preventing electrical materials deposited over the mask film 20 from contaminating other portions of the substrate. In another embodiment of the present invention, the adhesive may not be activated when the mask film 20 is applied over the substrate. Pressure supplied from, for example a roller or plate, may be employed to adhere the mask film 20 to the substrate 10. In an alternative embodiment, the adhesive may be pattern-wise light- or heat-curable, and light or heat is applied to the portions of the mask film in contact with the substrate 10. The patterned adhesive has the advantage of reducing adhesion to other areas where it adhesion may not be desirable.

The present invention provides many improvements over the prior art. The mask film may be inexpensive, for example, comprising PET (polyethylene teraphthalate) or other low-cost polymers provided in rolls. The film does not have to be repeatedly aligned with the substrate, as do traditional metal masks. Significant temperature dependencies may not arise (increased temperatures occur in evaporative and sputter deposition processes), since the mask film materials do not necessarily expand significantly in response to temperature; and if significant thermal expansion were to occur, the heat would only slightly decrease the area of the masking holes. If the masking holes were slightly oversized (as would be the case if a perimeter was ablated), no effect on the formation of the light-emitting area would result. Because the film covers all of the substrate, except those areas to be patterned with light-emitting materials, the substrate is protected from particulate contamination.

The present invention also provides a scalable means for manufacturing patterned light-emitting devices, since the mask film can be readily made in large sizes. Laser systems useful for ablating mask film materials may comprise many separate lasers, therefore enabling fast patterning. Such laser systems are known in the art. Mechanical removal of the mask film material enables fast turnaround on arbitrarily large substrates. The present invention can be employed in continuous processing systems.

The method of the present invention also finds application in the fabrication of other kinds of photonic and electronic devices, such as reflective and transmissive color displays where several materials used to construct the pixels require separate masks. This is particularly true in the case of color devices that generally require three separate colored materials to be patterned differently. Typically these devices also require a transparent conductor such as indium-tin-oxide, which may be deposited by sputtering and is conveniently patterned by one mask step using the present invention. Active-matrix displays, thin film transistors (TFTs), and capacitors may be fabricated for an active-matrix pixel. The TFT's gate dielectric and semiconductor layers typically require separate masks. Metal tracks may also be conveniently patterned by the present invention, and again will require a separate mask or masks. Other photonic devices such as photodetectors, photovoltaic cells, and optical waveguide structures may also be fabricated using the method of the present invention.

The present invention may be practiced with either active- or passive-matrix organic or inorganic LED devices. It may also be employed in display devices or in area illumination devices. In one embodiment, the present invention is employed in a flat-panel OLED device composed of small molecule or polymeric OLEDs, as disclosed in, but not limited to U.S. Pat. No. 4,769,292, issued Sep. 6, 1988 to Tang et al.; and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture. Inorganic or polymer light-emitting materials may also be employed and patterned according to the method of the present invention.

The invention has been described in detail with particular reference to certain preferred embodiments thereof, but it will be understood that variations and modifications can be effected within the spirit and scope of the invention.

PARTS LIST 10 substrate
12, 12A, 12B, 12C first electrode
14A, 14B, 14C electrical materials
16A, 16B, 16C electrical materials, electrode materials
17 protective or conductive layer
20 mask film
30 thin-film electrical devices
32 planarization or insulating layer
34 insulating element
36A, 36B, 36C bus area
40 first opening portion
42 second opening portion
44 third opening portion
50 first opening portion
52 second opening portion
54 third opening portion
56 fourth opening portion
58 fifth opening portion
60 sixth opening portion
100 locate mask film step
105 form first opening portions step
110 deposit first materials step
115 form second opening portions step
120 deposit second materials step
125 remove mask film step

The invention claimed is:

1. A method comprising in the following order the steps of:
   locating patterned electrodes on a substrate and an insulating element between the electrodes;
   locating a single pre-made mask film over the substrate;
   forming first opening portions in first locations in the single pre-made mask film;
   depositing first electrical materials over the substrate and the single pre-made mask film to form patterned areas in the first locations;
   forming second opening portions in second locations different from the first locations in the single pre-made mask film;
   depositing second electrical materials over the substrate and the single pre-made mask film to form patterned areas in the first and second locations; and
   removing the single pre-made mask film after the second electrical materials are deposited, wherein the entire single pre-made mask film is removed.

2. A method comprising in the following order the steps of:
   locating patterned electrodes on a substrate and an insulating element between the electrodes;
   locating a single pre-made mask film over the substrate;
   forming first opening portions in first locations in the single pre-made mask film;
   depositing first electrical materials over the substrate and the single pre-made mask film to form patterned areas in the first locations;
   forming second opening portions in second locations different from the first locations in the single pre-made mask film;
   depositing second electrical materials over the substrate and the single pre-made mask film to form patterned areas in the first and second locations;
   forming third opening portions in third locations different from the first and second locations in the single pre-made mask film;
   depositing third electrical materials over the substrate and the single pre-made mask film to form patterned areas in the first, second, and third locations; and
   removing the single pre-made mask film after the third electrical materials are deposited, wherein the entire single pre-made mask film is removed.

3. The method of claim 1, wherein the electrical materials are one or more of the following: light-emitting materials, non-transparent conductive materials, transparent conductive materials, charge-control materials, and semi-conductive materials.

4. The method of claim 1, wherein the electrical materials include one or more of the following: organic, metal oxide, silicon, doped silicon, zinc oxide, doped zinc oxide, quantum dots, metal, or metal alloy materials.

5. The method of claim 1, wherein the electrical materials are deposited by evaporation, sputtering, spray, curtain, or inkjet deposition.

6. The method of claim 1, wherein at least some of the electrical materials are light-emitting materials and at least some of the formed patterned areas emit light.

7. The method of claim 4, wherein the electrical materials comprise a plurality of different electrical materials deposited in different layers.

8. The method of claim 7, wherein either a metal layer, metal alloy layer, or metal oxide layer is the last layer formed before the second opening portion is formed.

9. The method of claim 7, wherein one of the patterned areas has deposited thereon first and second layers and another patterned area has only the second layer.

10. The method of claim 7, wherein the electrical materials deposited in one patterned area are a subset of the electrical materials deposited in a different patterned area.

11. The method of claim 1, wherein one patterned area is a light-emitting area and another patterned area is a conductive bus area.

12. The method of claim 1, wherein the first opening portions are formed by segmented material in the first locations or wherein the first opening portions are formed by segmenting the single pre-made mask film around the periphery of the first locations and mechanically removing the single pre-made mask film within the periphery.

13. The method of claim 1, wherein the single pre-made mask film is segmented around the periphery of the first and second locations before the first materials are deposited.

* * * * *